(12) United States Patent
Suzuki et al.

(10) Patent No.: US 8,871,433 B2
(45) Date of Patent: Oct. 28, 2014

(54) METHOD FOR PRODUCING MICROSTRUCTURE

(75) Inventors: Takaaki Suzuki, Takamatsu (JP); Hidetoshi Kotera, Kyoto (JP); Isaku Kanno, Kobe (JP); Daisuke Hiramaru, Kyoto (JP)

(73) Assignees: Kyoto University, Kyoto-Shi (JP); Kagawa University, Takamatsu-Shi (JP)

(*) Notice: Subject to any disclaimer, the term of this patent is extended or adjusted under 35 U.S.C. 154(b) by 69 days.

(21) Appl. No.: 13/501,897

(22) PCT Filed: Oct. 14, 2010

(86) PCT No.: PCT/JP2010/068047
§ 371 (c)(1),
(2), (4) Date: May 4, 2012

(87) PCT Pub. No.: WO2011/046169
PCT Pub. Date: Apr. 21, 2011

(65) Prior Publication Data
US 2012/0214104 A1    Aug. 23, 2012

(30) Foreign Application Priority Data
Oct. 14, 2009    (JP) .................... 2009-237709

(51) Int. Cl.
| | | |
|---|---|---|
| *G03F 7/20* | (2006.01) | |
| *G03F 7/00* | (2006.01) | |
| *B81C 1/00* | (2006.01) | |
| *B81C 99/00* | (2010.01) | |
| *G03F 1/00* | (2012.01) | |
| *G03F 1/38* | (2012.01) | |

(52) U.S. Cl.
CPC ............ *G03F 7/0037* (2013.01); *G03F 7/2002* (2013.01); *G03F 7/201* (2013.01); *B81C 1/00126* (2013.01); *B81C 99/002* (2013.01); *G03F 1/14* (2013.01); *G03F 1/38* (2013.01)
USPC ............................ 430/397; 430/311; 430/396

(58) Field of Classification Search
CPC ............................... G03F 7/2002; G03F 7/201
USPC ............................................ 430/311, 396, 397
See application file for complete search history.

(56) References Cited

U.S. PATENT DOCUMENTS

| | | | |
|---|---|---|---|
| 4,152,154 A | * | 5/1979 | Geenen et al. ................. 430/24 |
| 5,447,339 A | | 9/1995 | Marchal et al. |
| 2007/0003839 A1 | | 1/2007 | Rabarot et al. |

FOREIGN PATENT DOCUMENTS

| | | |
|---|---|---|
| JP | H06-176408 A | 6/1994 |
| JP | H09-283434 | 10/1997 |
| JP | H10-305670 A | 11/1998 |
| JP | 2008-129558 | 6/2008 |
| WO | WO 2006/098430 | 9/2006 |
| WO | WO 2009/044901 A1 | 4/2009 |

OTHER PUBLICATIONS

Manhee Han et al., 3D microfabrication with inclined/rotated UV lithography, Sensors and Actuators A, Mar. 2004, pp. 14-20, vol. 111, issue 1, Elsevier.
Kei Hanai et al., Three Dimensional Fabrication by Inclined Rotary Exposure, The Transactions of the Institute of Electrical Engineers of Japan E, 2006, pp. 222-227, vol. 126, No. 6, English abstract only.

* cited by examiner

*Primary Examiner* — Kathleen Duda
(74) *Attorney, Agent, or Firm* — Manabu Kanesaka

(57) ABSTRACT

The disclosed method for producing a microstructure can form a complicated three-dimensionally formed microstructure with few steps.
A first mask pattern (22) containing a light transmitting section and a light blocking section is disposed along an unexposed photosensitive resin (42), and a second mask pattern (32) containing a light transmitting section and a light blocking section is disposed on the reverse side of the first mask pattern (22) from the photosensitive resin (42). Additionally, by means of integrally rotating the photosensitive resin (42) and the first mask pattern (22) around a central axis (Z) that passes through the photosensitive resin (42) and the first mask pattern (22), and at the same time radiating exposure light from the reverse side of the second mask pattern (32) from the photosensitive resin (42) and the first mask pattern (22) in a direction that is inclined obliquely with respect to the direction of the central axis (Z), the light beam of the exposure light that is transmitted through the light transmitting section of the second mask pattern (32) and the light transmitting section of the first mask pattern (22) exposes the photosensitive resin (42).

6 Claims, 15 Drawing Sheets

(a)

(b)

(a)

(b)

(a)

(b)

(a)

(b)

METHOD FOR PRODUCING MICROSTRUCTURE

RELATED APPLICATIONS

The present application is National Phase of International Application No. PCT/JP2010/068047 filed on Oct. 14, 2010, and claims priority from Japanese Application No. 2009-237709, filed on Oct. 14, 2009.

TECHNICAL FIELD

The present invention relates to a method for producing microstructure, and particularly relates to a method for producing microscopic three-dimensionally formed microstructure.

BACKGROUND ART

Conventionally, there have been proposed various sorts of techniques for forming a microscopic three-dimensional steric shape using mask patterns and light curing resin.

For example, as shown in FIG. 18, a tilt exposure method in which light curing resin 223 on a transparent mask plate 221 on which a mask pattern 222 is formed is exposed to light from different directions as shown by arrows 224a and 224b, and an unexposed portion 224k of the light curing resin 223 is removed to form a steric shape has been proposed (refer to Patent Document 1, for example).

Further, there is disclosed an example of trial production that microstructures which are arrayed to stand together in large numbers in a reticular pattern are processed three-dimensionally as shown in a photograph of FIG. 20 by a rotating tilt exposure method in which a light curing resin (SU-8) and a mask plate are placed on a rotating stage whose central axis is tilted toward a direction of light exposure, to perform light exposure as shown in explanatory diagrams of FIG. 19 (refer to Non-patent Document 1, for example). By devising mask patterns to be used in a rotating tilt exposure method, it is possible to form a nozzle shape, a flow channel structure which is three-dimensionally branched, and the like (refer to Patent Document 2, for example).

As other methods, a direct drawing method for drawing a steric shape while moving a specific light source, a method in combination with a multistage exposure method using many masks, and the like have been proposed.

In a tilt exposure method and a rotating tilt exposure method, it is possible to produce those in a single light exposure, and its number of processes is small and large-scale facilities are not needed, which makes it possible to manufacture a microstructure at low cost in comparison to the other methods.

CITATION LIST

Patent Literature

Patent Document 1: WO 2006/098430
Patent Document 2: WO 2009/044901

Non Patent Literature

Non-patent Document 1: Kei HANAI, Takashi NAKAHARA, Shinnya SUZUKI, Yoshinori MATSUMOTO, "Three Dimensional Fabrication by Inclined Rotary Exposure", The Transactions of the Institute of Electrical Engineers of Japan E, 2006, vol. 126, no. 6, pages 222 to 227

DISCLOSURE OF INVENTION

Problem to be Solved by the Invention

However, microstructures which can be formed by the tilt exposure method or a rotating tilt exposure method are limited to relatively simple steric shapes, and the freedom of structure is low. Therefore, in the case where an attempt is made to form a complicated steric-shaped microstructure, it is necessary to form it so as to superpose simple steric shapes by repeating light exposure, and it is impossible to form it in a small number of processes.

The present invention has been achieved in consideration of such circumstances, and an object of the present invention is to provide a method for producing a microstructure in which it is possible to form a complicated steric-shaped microstructure in a small number of processes.

Means for Solving Problem

In order to solve the above-described problems, the present invention provides a method for producing a microstructure which is configured as follows.

A method for producing a microstructure comprises (i) a first step of disposing a photosensitive resin along a first mask pattern and disposing a second mask pattern on a side of the first mask pattern opposite the photosensitive resin, the photosensitive resin being unexposed, the first mask pattern containing a light-transmitting part in which amount of light transmitting therethrough is relatively large and a light-blocking part in which amount of light transmitting therethrough is relatively small, the second mask pattern containing a light-transmitting part in which amount of light transmitting therethrough is relatively large and a light-blocking part in which amount of light transmitting therethrough is relatively small, (ii) a second step of integrally rotating the photosensitive resin and the first mask pattern round a central axis of rotation passing through the photosensitive resin and the first mask pattern, and irradiating an exposure light from a side of the second mask pattern opposite the photosensitive resin and the first mask pattern in a direction angularly disposed relative to the central axis, thereby exposing the photosensitive resin to a light flux of the exposure light transmitting through the second mask pattern and the first mask pattern.

The above-described method is realized so as to expose the first mask pattern and the photosensitive resin to the light while rotating those in a tilted state to the exposure light. The photosensitive resin exposed to the light in the second step is developed, thereby it is possible to produce a microstructure. For example, in the case where the photosensitive resin is negative resist, an unexposed portion in which amount of light exposure (amount of absorption of light) does not reach a threshold value is removed due to development, to form a microstructure from an exposed portion. In the case where the photosensitive resin is positive resist, an exposed portion is removed due to development, to form a microstructure from an unexposed portion.

In accordance with the above-described method, by a combination of the light-transmitting part and the light-blocking part of the first mask pattern and the light-transmitting part and the light-blocking part of the second mask pattern, and according to a rotational state of the first mask pattern, it is possible to irradiate a desired position inside the photosensitive resin with a light flux from a desired direction, which makes it possible to produce a complicated steric-shaped microstructure. Further, it is possible to produce a complicated steric-shaped microstructure in a single process.

Preferably, the photosensitive resin and the first mask pattern contact each other, and a boundary face between the photosensitive resin and the first mask pattern is a plane surface perpendicular to the central axis. During the second step, the second mask pattern is disposed parallel to the first mask pattern.

In this case, because it is possible to suppress the effects by refraction, reflection, roundabout of light, and the like, which makes it easy to design the first mask pattern and the second mask pattern and to adjust positions thereof, it is possible to more precisely produce a microstructure.

Preferably, the light-transmitting part of the second mask pattern includes a fan-shaped light-transmitting part having a fan shape which is formed continuously between a pair of line segments extending radially with respect to a circle centering on the central axis.

In this case, the pair of line segments of the light-transmitting part of the second mask pattern are to be the positions at which light exposure of the photosensitive resin is started or terminated after the light flux of the exposure light transmitting through the fan-shaped light-transmitting part of the second mask pattern transmits through the light-transmitting part of the rotating first mask pattern. In the case where a rotating speed of the first mask pattern is constant, a light exposure time of exposing the photosensitive resin is proportional to an angle made by the pair of line segments of the light-transmitting part of the second mask pattern. Therefore, it is easy to design the first and second mask patterns, and to control an amount of light exposure.

In a preferred aspect of the invention, the photosensitive resin is light curing resin. The light-transmitting part of the first mask pattern includes a plurality of microscopic first light-transmitting parts which are disposed concentrically with respect to the central axis and are spaced circumferentially with respect to a circle centering on the central axis, The light-transmitting part of the second mask pattern includes a pair of second light-transmitting parts which are formed on both sides of a virtual line with respect to a virtual plane, the virtual plane includes the central axis and is parallel to a direction of the exposure light, the virtual line is orthogonal to the virtual plane and passes through a central point on which the central axis and the second mask pattern cross, During the second step, the light curing resin is exposed in a reticulated shape extending concentrically with respect to the central axis due to the exposure light passing through the second light-transmitting part and the first light-transmitting part.

In this case, it is possible to easily produce a microstructure having a reticulated structure concentrically extending with respect to the central axis.

Effects of the Invention

In accordance with the present invention, it is possible to form a complicated steric-shaped microstructure in a small number of processes.

BEST MODE FOR CARRYING OUT THE INVENTION

Hereinafter, embodiments of the present invention will be described with reference to FIGS. 1 to 17.

A light exposure device 10 used for producing a microstructure will be described with reference to FIGS. 1 to 3.

Figure 1:
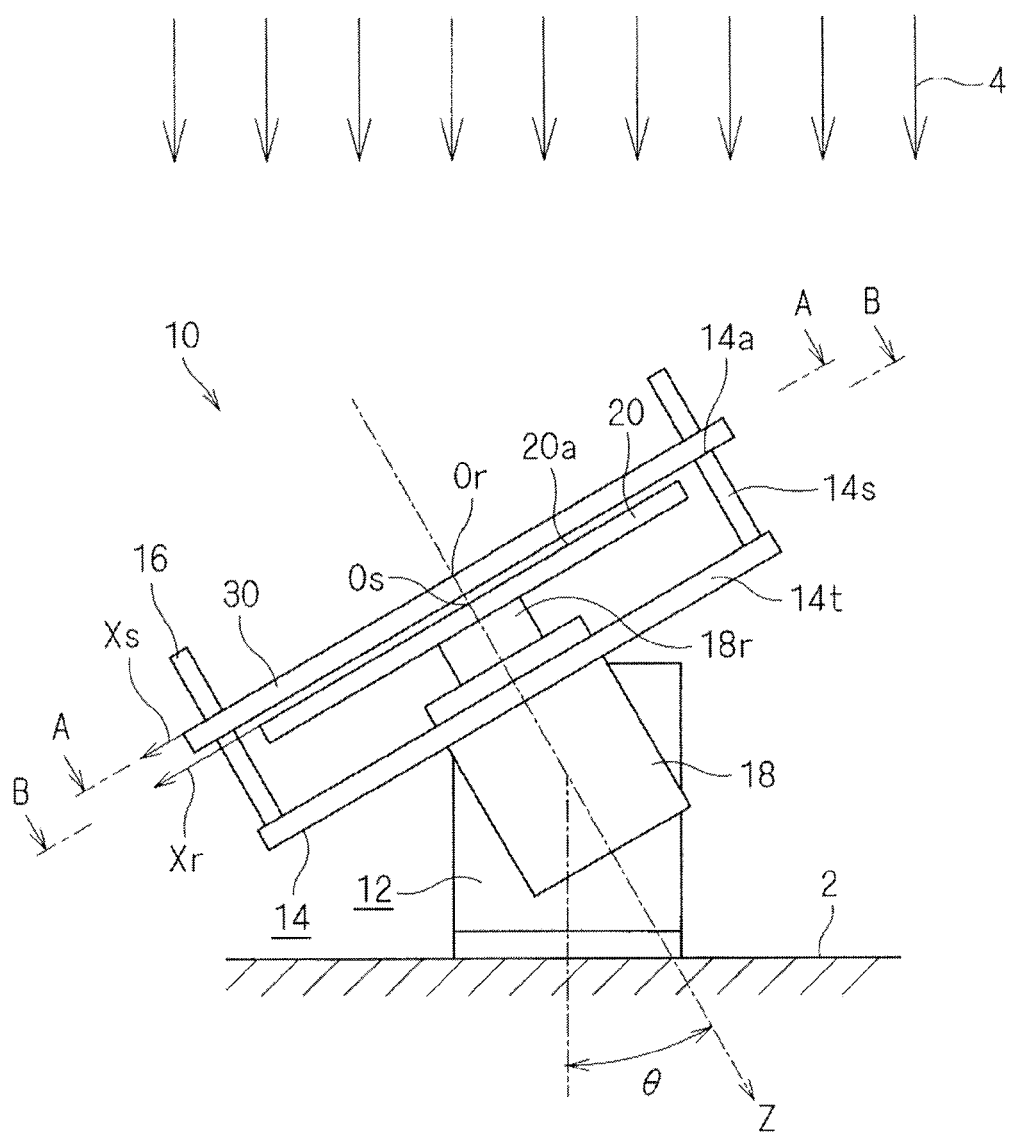
FIG. 1 is a schematic view schematically showing a configuration of a light exposure device. (Embodiment 1)

FIG. 1 is a schematic view showing a configuration of the light exposure device 10. FIGS. 2A and 2B are perspective views showing the configuration of the light exposure device 10. FIG. 2A shows a state in which a fixed mask attachment plate 30 is detached. FIG. 2B shows a state in which the fixed mask attachment plate 30 is attached. FIG. 3A is a cross-sectional view of a fixed mask plate 31. FIG. 3B is a cross-sectional view of a rotating table 20 to which a rotating mask plate 21 and the like are fixed.

Figure 2:
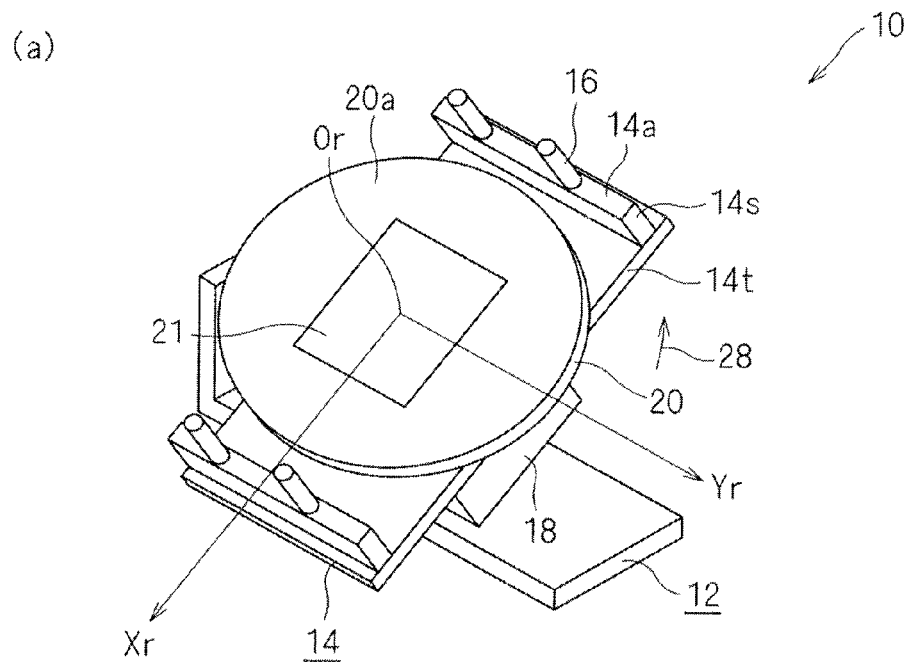
FIG. 2(a) is a perspective view schematically showing the configuration of the light exposure device in which a fixed mask attachment plate is detached and FIG. 2(b) is a perspective view schematically showing the configuration of the light exposure device in which the fixed mask attachment plate is attached. (Embodiment 1)
Figure 2:
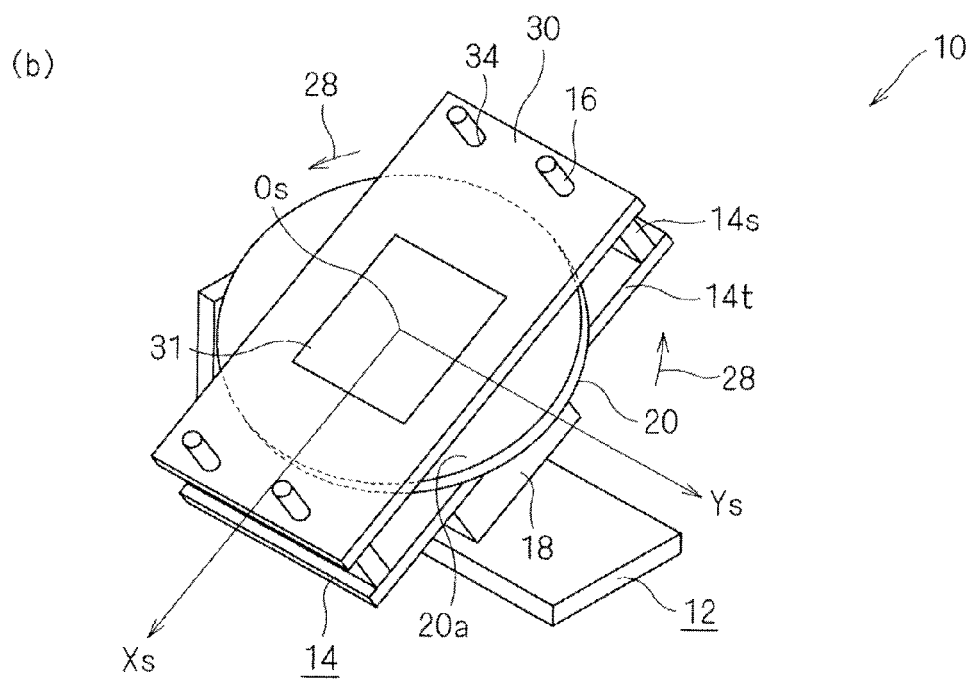
Figure 3:
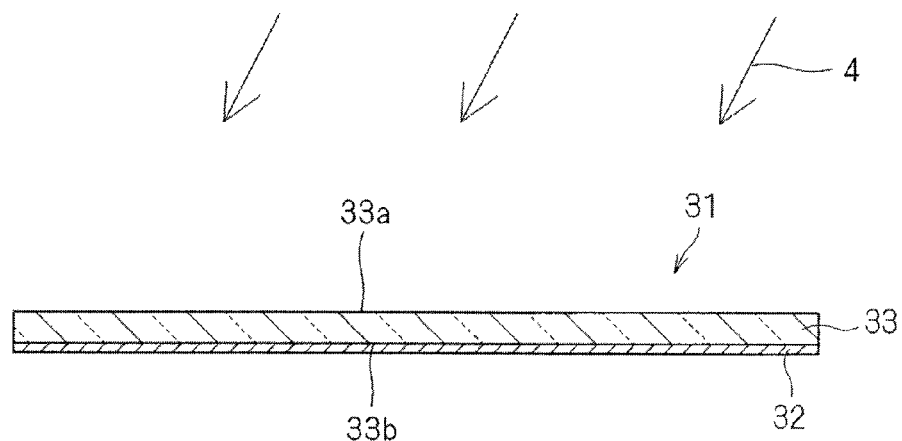
FIG. 3(a) is a cross-sectional view of a fixed mask plate.
FIG. 3(b) is a cross-sectional view of a main part of a rotating table to which a rotating mask plate and the like are fixed. (Embodiment 1)
Figure 3:
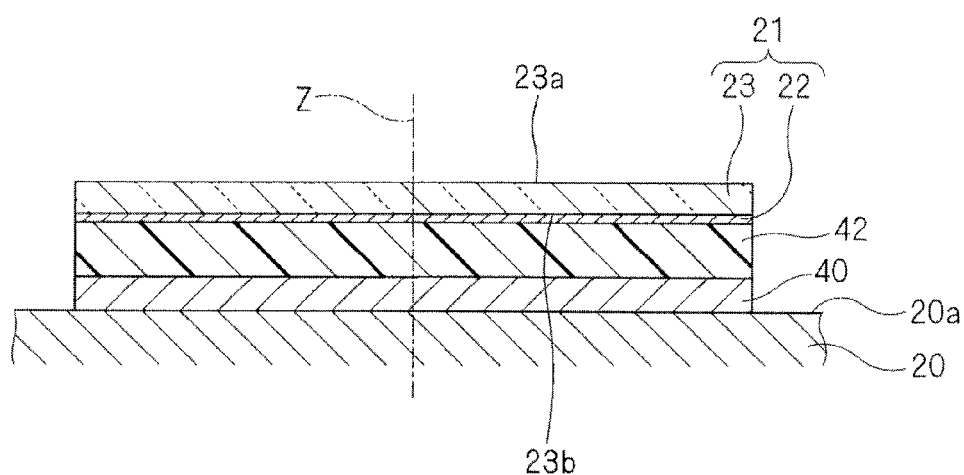

As shown in FIGS. 1 and 2, the light exposure device 10 includes a fixation unit 12 to be fixed to a base table 2, and a tilt unit 14 to be fixed to the fixation unit 12.

Regarding the tilt unit 14, a main body part 14t to be fixed to the fixation unit 12 is provided with the rotating table 20 which is rotary-driven by a motor 18. A top surface 20a of the rotating table 20 is perpendicular to a central axis z of the rotating table 20. The tilt unit 14 is fixed to the fixation unit 12 in a state in which the central axis z is tilted at an angle θ to the direction of irradiation of exposure light shown by arrows 4.

As shown in FIG. 3B, it is fixed onto the top surface 20a of the rotating table 20 in a state in which photosensitive resin 42 is sandwiched between the rotating mask plate 21 and a support substrate 40.

Regarding the rotating mask plate 21, a mask pattern (hereinafter referred to as "rotating mask pattern" as well) 22 is formed on one principal surface 23b of a transparent substrate 23. The mask pattern 22 includes a light-blocking part that blocks transmission of light, and a light-transmitting part (not shown in FIG. 3B) that allows transmission of light.

The rotating mask plate 21 and the support substrate 40 are disposed parallel to one another, and are respectively fixed to the rotating table 20 so as to be perpendicular to the central axis z. The boundary face between the mask pattern 22 of the rotating mask plate 21 and the photosensitive resin 42 is to be a plane surface perpendicular to the central axis z.

FIG. 3B shows a case where the mask pattern 22 is in contact with the photosensitive resin 42. Meanwhile, a mask pattern may be formed on the other principal surface 23a of the transparent substrate 23, which is on the opposite side of the photosensitive resin 42, so as not to bring the mask pattern into contact with the photosensitive resin 42. By comparing the both cases, it is preferable to bring the mask pattern into contact with the photosensitive resin as shown in FIG. 3B, because the effects of refraction, reflection, diffraction and the like due to the interposition of the transparent substrate at the time of light exposure are lessened, which makes it possible to produce a more precise microstructure.

As shown in FIGS. 1 and 2, in the tilt unit 14, in order to fix the fixed mask attachment plate 30, a pair of side panels 14s are fixed to the both ends in the direction of tilt of the main body part 14t, attachment posts 16 are provided upright on the end faces 14a of the respective side panels 14s. The fixed mask attachment plate 30 is fixed at intervals from the rotating table 20 and the rotating mask plate 21 in a state in which it is placed on the end faces 14a of the pair of side panels 14s, and is positioned by thoroughly inserting the attachment posts 16 into through holes 34 formed in the both ends of the fixed mask plate 30.

As shown in FIG. 2B, the fixed mask plate 31 is attached onto the fixed mask attachment plate 30. In the fixed mask plate 31, as shown in FIG. 3A, a mask pattern (hereinafter referred to as "fixed mask pattern" as well) 32 is formed in the one principal surface 33b of the transparent substrate 33. The mask pattern 32 includes a light-blocking part that blocks transmission of light and a light-transmitting part (not shown in FIG. 3A) that allows transmission of light.

The fixed mask plate 31 is disposed such that the one principal surface 33b of the transparent substrate 33, that is the mask pattern 32, is perpendicular to the central axis z. It is preferable that the fixed mask plate 31 be disposed such that the one principal surface 33b of the transparent substrate 33 on which the mask pattern is disposed is on the side of the rotating table 20 and the rotating mask plate 21 so as to lessen the effects of the transparent substrate 33 at the time of light exposure, and the other principal surface 33a of the transparent substrate on which the mask pattern 32 is not formed is disposed on the side of the light source.

In the light exposure device 10, when it is irradiated with exposure light in a direction shown by arrows 4 in FIG. 1, the rotating table 20 rotates as shown by arrow 28 in FIG. 2. In accordance therewith, the light flux of exposure light transmits through the light-transmitting part of the mask pattern 32 of the fixed mask plate 31, and thereafter transmits through the light-transmitting part of the mask pattern 22 of the rotating mask plate 21 fixed to the rotating table 20 to reach the photosensitive resin 42 disposed via the support substrate 40 on the rotating table 20, thereby exposing the photosensitive resin 42 to the light.

After the light exposure, one of the exposed portion in which amount of light exposure (amount of absorption of light) exceeds a threshold value and the unexposed portion in which amount of light exposure (amount of absorption of light) does not reach the threshold value is removed from the photosensitive resin, to be able to produce a microstructure with the other thereof. That is, in the case of negative-type photosensitive resin, the unexposed portion is removed from the photosensitive resin, to produce a microstructure with the exposed portion. In the case of positive-type photosensitive resin, the exposed portion is removed from the photosensitive resin, to produce a microstructure with the unexposed portion.

By use of the light exposure device 10 of Embodiment 1, partial light exposure with multiple masks in combination of rotating mask patterns and fixed mask patterns and a rotating tilt exposure method are combined to be able to produce a microstructure in the following embodiments 2 to 4. In Embodiments 2 to 4, negative-type light curing resin is used as photosensitive resin.

Embodiment 2

By combining a fixed mask pattern 32a shown in FIG. 4A and a rotating mask pattern 22a shown in FIGS. 4B and 4C, it is possible to produce a microstructure shown in FIG. 7A.

Figure 4:
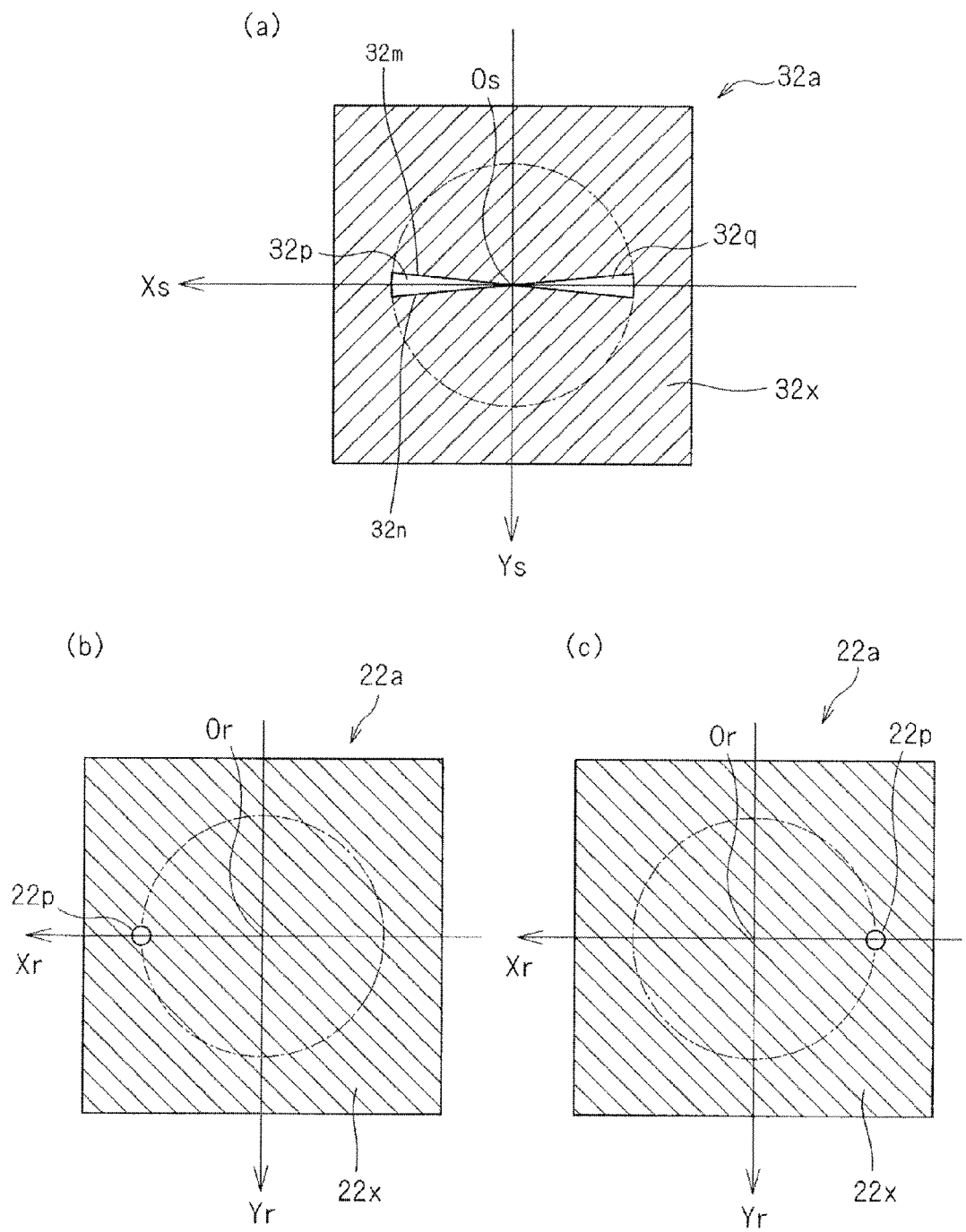
FIG. 4(a) is a schematic view of a mask pattern viewed along the line A-A in FIG. 1.
FIG. 4(b) is a schematic view of a mask pattern viewed along the line B-B in FIG. 1.
FIG. 4(c) is another schematic view of a mask pattern viewed along the line B-B in FIG. 1. (Embodiment 2)
Figure 5:
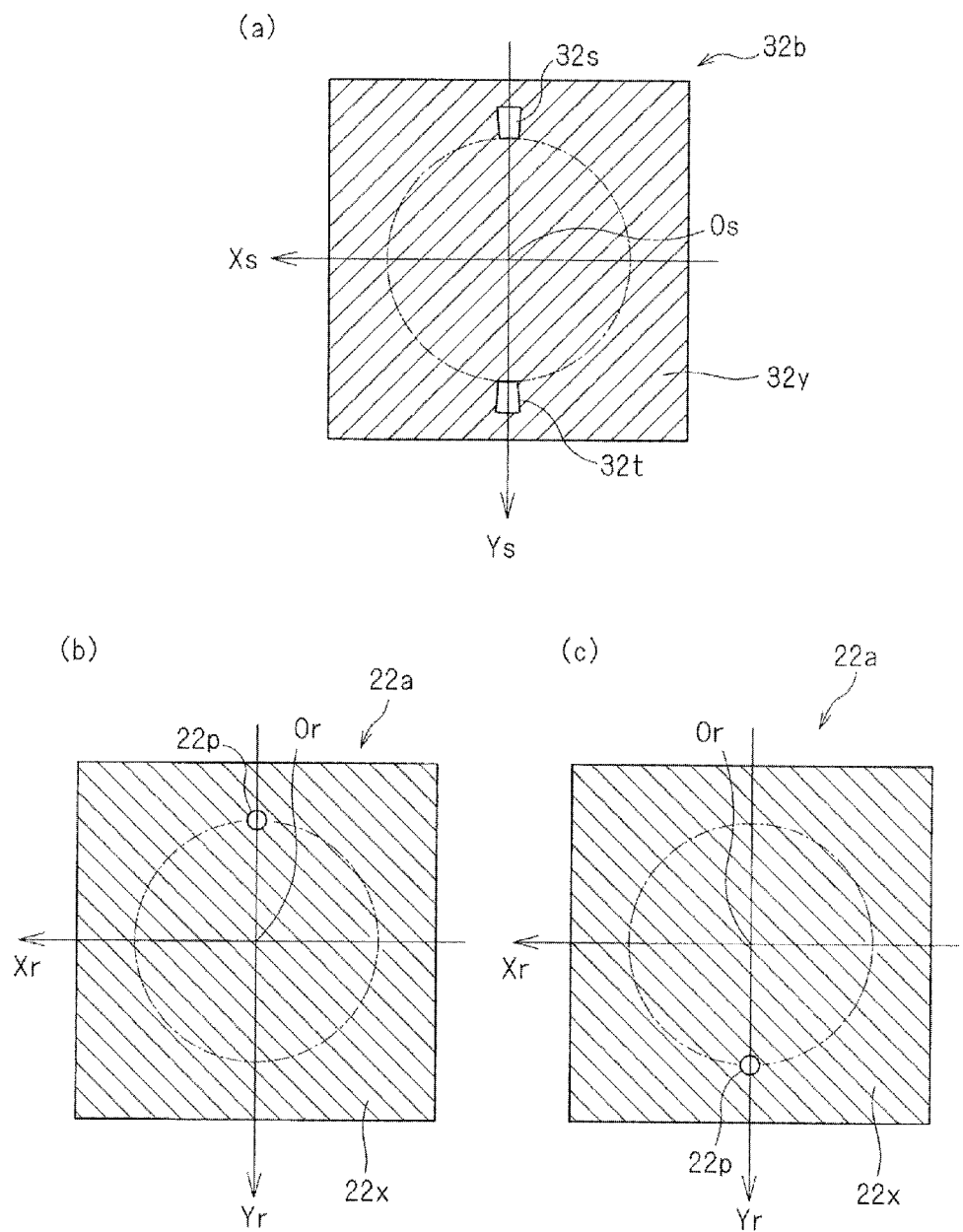
FIG. 5(a) is another schematic view of a mask pattern viewed along the line A-A in FIG. 1.
FIG. 5(b) is yet another schematic view of a mask pattern viewed along the line B-B in FIG. 1.
FIG. 5(c) is yet another schematic view of a mask pattern viewed along the line B-B in FIG. 1. (Embodiment 3)
Figure 6:
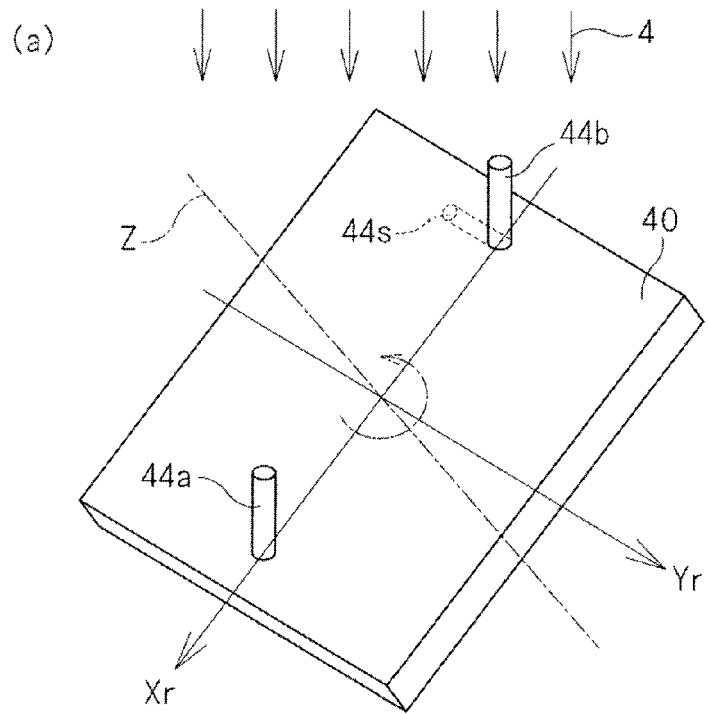
FIG. 6(a) is a perspective view schematically showing a microstructure with a rod-shaped portion formed on the support substrate and FIG. 6(b) is another perspective view schematically showing a microstructure with a rod-shaped portion formed on the support substrate. (Embodiments 2 and 3)
Figure 6:
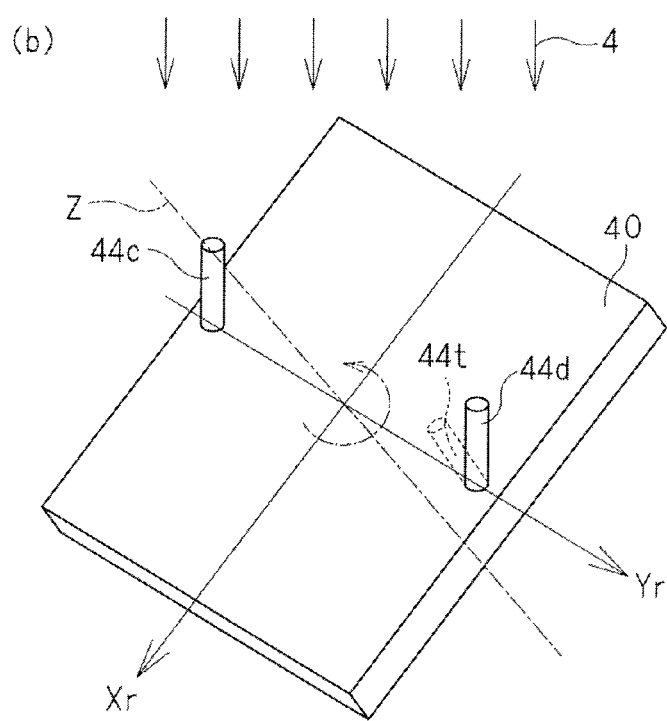
Figure 7:
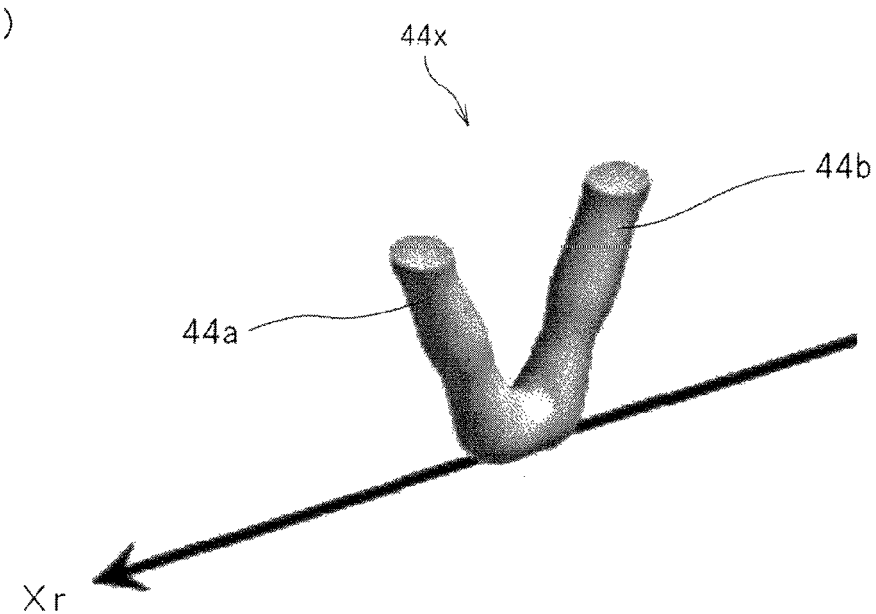
FIG. 7(a) is a simulation view of the microstructure and FIG. 7(b) is another simulation view of the microstructure. (Embodiments 2 and 3)
Figure 7:
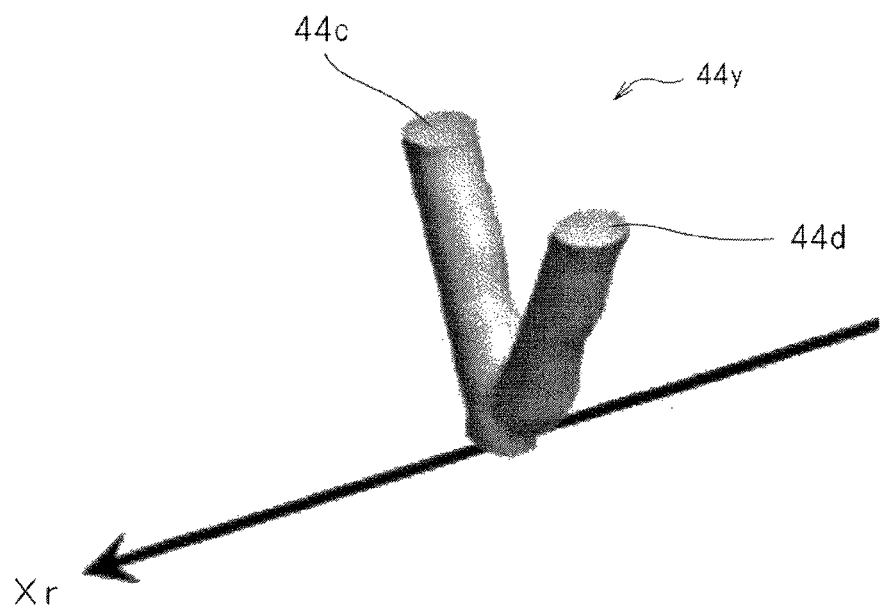
Figure 8:
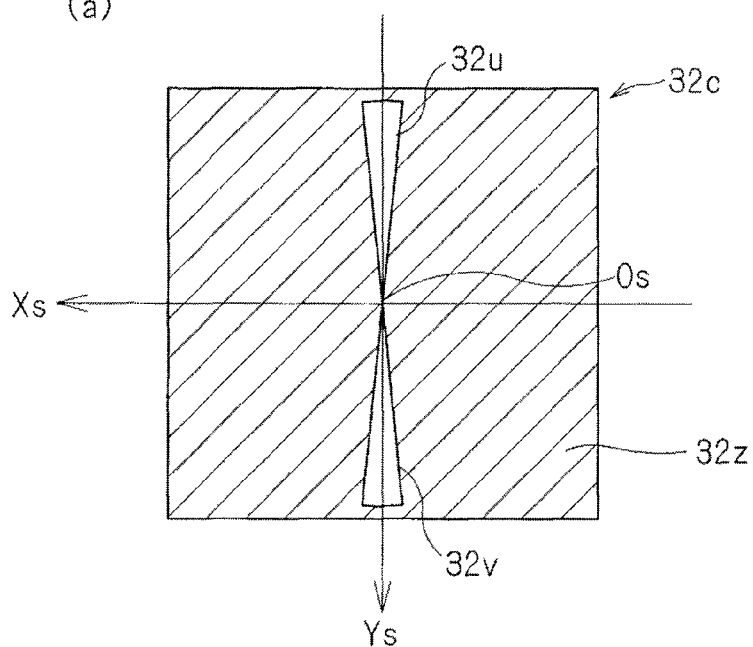
FIG. 8(a) is yet another schematic view showing a mask pattern viewed along the line A-A in FIG. 1.
FIG. 8(b) is yet another schematic view showing a mask pattern viewed along the line B-B in FIG. 1.
FIG. 8(c) is a partial enlarged view of FIG. 8(b). (Embodiment 4)
Figure 8:
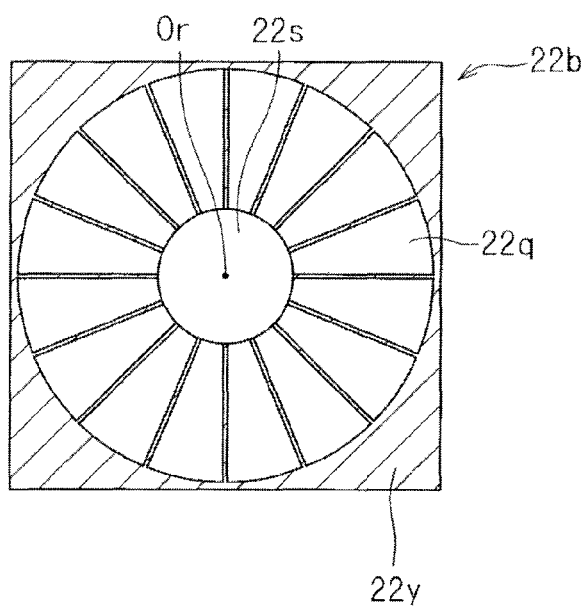
Figure 8:
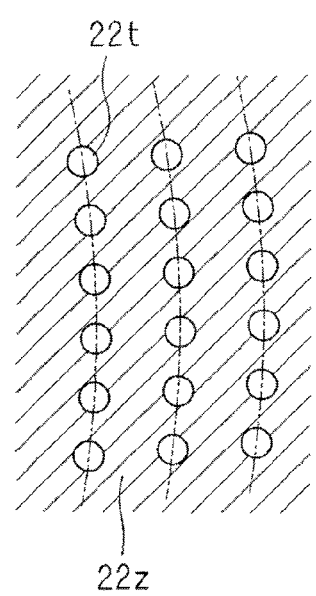
Figure 9:
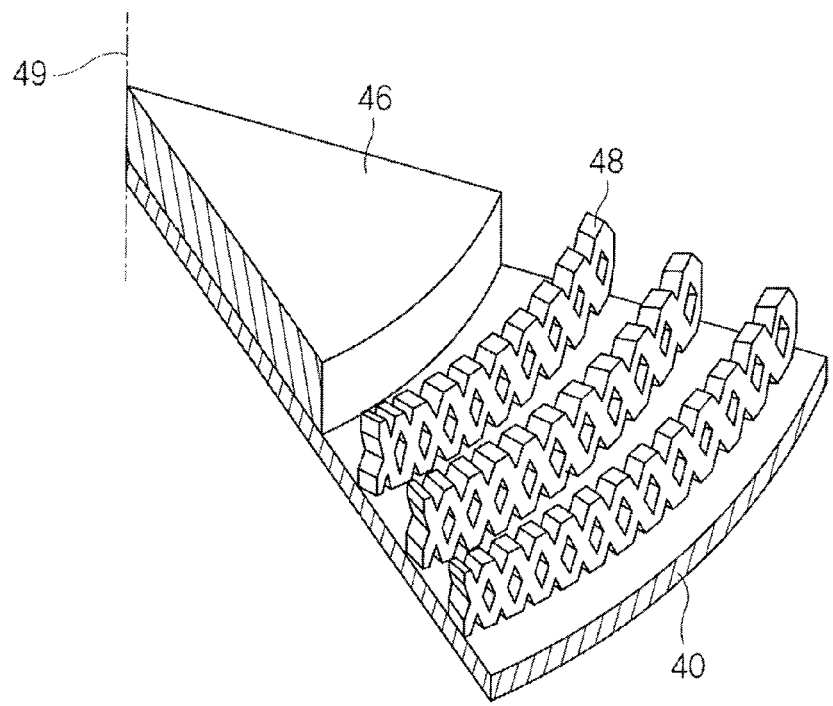
FIG. 9(a) is a perspective view of a main part of the microstructure and FIG. 9(b) is a perspective view of a main part of the microstructure used in the experimental procedure. (Embodiment 4)
Figure 9:
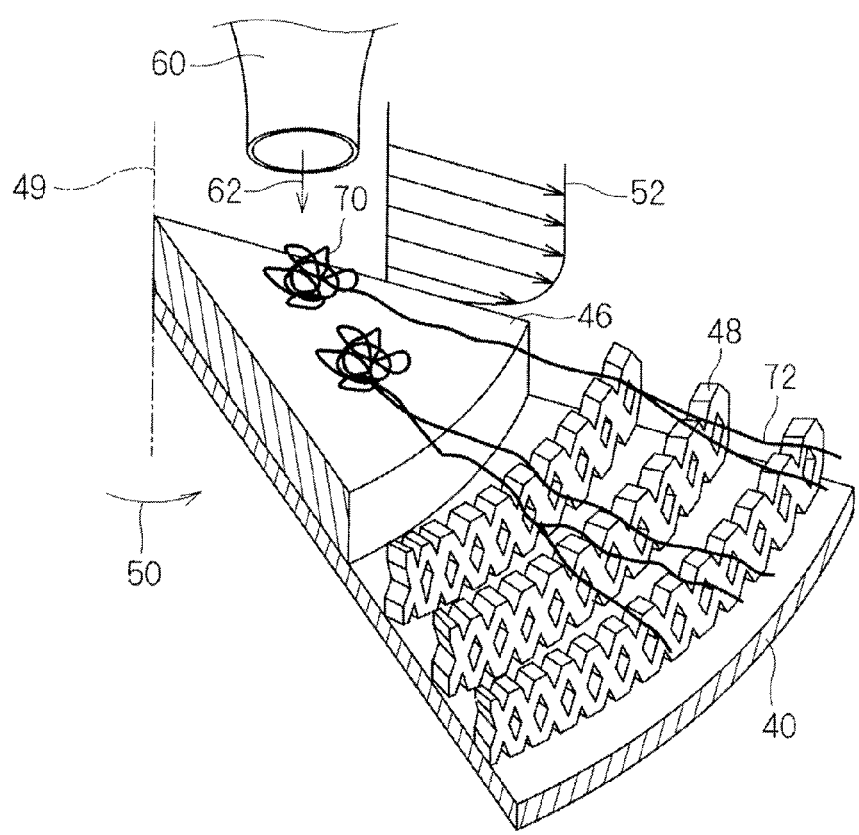

FIG. 4A is a schematic view of the fixed mask pattern viewed along the line A to A in FIG. 1. FIGS. 4B and 4C are schematic views of the rotating mask pattern viewed along the line B to B in FIG. 1. Directions of tilt Xs and Xr shown in FIGS. 2 and 4 are a direction of the line of intersection of a virtual plane which includes the central axis z and extends parallel to the direction of exposure light and a plane surface including the mask pattern. FIG. 7A shows a three-dimensional shape formed by a portion in which amount of light exposure (amount of absorption of light) exceeds a predetermined threshold value after an amount of light exposure (amount of absorption of light) at each point in the photosensitive resin is calculated from a light path of the light flux with which the photosensitive resin is irradiated according to a rotation of the rotating table.

As shown in FIG. 4A, the fixed mask pattern 32a includes a pair of light-transmitting parts 32p and 32q formed into fan shapes symmetrical with respect to a central point Os through which the central axis z passes, and a shaded light-blocking part 32x. The light-transmitting parts 32p and 32q are formed on the both sides of the direction of tilt Xs. The light-transmitting parts 32p and 32q are a fan-shaped light-transmitting part having fan shapes formed continuously between a pair of line segments 32m and 32n extending radially from the central axis z.

As shown in FIGS. 4B and 4C, the mask pattern 22a of the rotating mask plate includes one circular light-transmitting part 22p formed at a position distant from the central point Or through which the central axis x passes, and a shaded light-blocking part 22x. FIG. 4B shows the case where the light-transmitting part 22p is located at the lowermost position in the direction of tilt Xs according to a rotation of the rotating table. FIG. 4C shows the case where the light-transmitting part 22p is located at the uppermost position in the direction of tilt Xs according to a rotation of the rotating table.

The light-transmitting part 22p of the rotating mask pattern formed on the rotating mask plate moves on the circumferential orbit around the central point Or according to a rotation of the rotating table. The rotating mask pattern is irradiated thereon with the light flux transmitting through the light-transmitting part of the fixed mask pattern. When the light-transmitting part 22p passes through the region on the rotating mask pattern which is irradiated with the light flux, the light flux transmits through the light-transmitting part 22p, and the photosensitive resin is irradiated with the light flux.

When the light-transmitting part 22p of the rotating mask pattern passes through the lowermost position in the direction of tilt as shown in FIG. 4B, after the entire portion of the light-transmitting part 22p of the rotating mask pattern passes through the region on the rotating mask pattern which is irradiated with the light flux transmitting through the light-transmitting parts on the lower side in the direction of tilt of the fixed mask pattern shown in FIG. 4A, the region inside the photosensitive resin which is irradiated with the light flux transmitting through the light-transmitting part 22p of the rotating mask pattern is formed into a cylindrical shape.

When an amount of light exposure (amount of absorption of light) of this cylindrical irradiated region exceeds the threshold value, a rod-shaped portion 44a is formed as schematically shown in a perspective view of FIG. 6A. This portion 44a extends parallel to the direction of irradiation of the exposure light to be tilted to the support substrate 40, and is tilted such that its leading end side approaches the central axis z. Even when this portion 44a moves according to a rotation of the rotating table, the portion 44a is tilted such that its leading end approaches the central axis as shown by a broken line 44s, for example.

On the other hand, when the light-transmitting part 22p of the rotating mask pattern 22a passes through the uppermost position in the direction of tilt as shown in FIG. 4C, after the entire portion of the light-transmitting part 22p of the rotating mask pattern passes through the region on the rotating mask pattern which is irradiated with the light flux transmitting through the light-transmitting parts on the upper side in the direction of tilt of the fixed mask pattern shown in FIG. 4A, the region inside the photosensitive resin which is irradiated with the light flux transmitting through the light-transmitting part 22p of the rotating mask pattern is formed into a cylindrical shape.

When an amount of light exposure (amount of absorption of light) of this cylindrical irradiated region exceeds the threshold value, a rod-shaped portion 44b is formed as schematically shown in the perspective view of FIG. 6A. This portion 44b extends parallel to the direction of irradiation of the exposure light to be tilted to the support substrate 40, and is tilted such that its leading end side is distant from the central axis z.

The two portions 44a and 44b shown by the solid lines so as to be divided in FIG. 6A actually have a base end in common on the side of the support substrate 40. Accordingly, by the combination of the fixed mask pattern and the rotating mask pattern, as shown in a simulation view of FIG. 7A, a V-shaped microstructure 44x in which the two portions 44a and 44b are tilted toward the sides opposite to one another radially from the central axis z is formed.

The pair of line segments 32m and 32n of the light-transmitting parts 32p and 32q of the fixed mask pattern 32a corresponds to a position at which the light-transmitting part 22p of the rotating mask pattern 22a starts or terminates passage through the region which is irradiated with the light flux of the exposure light transmitting through the light-transmitting parts 32p and 32q of the fixed mask pattern 32a, to be served as a position at which light exposure of the photosensitive resin 42 is started or terminated. In the case where the rotating mask pattern 22a rotates at a constant speed, the light exposure time in which the photosensitive resin 42 is exposed to the light is proportional to an angle made by the pair of line segments 32m and 32n of the light-transmitting parts 32p and 32q of the fixed mask pattern 32a. Therefore, with the fan-shaped light-transmitting part having the fan shapes in which the light-transmitting parts 32p and 32q are formed continuously between the pair of line segments 32m and 32n, it is easy to design the mask patterns 22a and 32a and control an amount of light exposure.

Embodiment 3

By using a fixed mask pattern 32b shown in FIG. 5A and a rotating mask pattern 22b shown in FIG. 5B in combination, it is possible to produce a microstructure shown in FIG. 7B.

FIG. 5A is a schematic view of the fixed mask pattern viewed along the line A to A in FIG. 1. FIGS. 5B and 5C are schematic views of the rotating mask pattern viewed along the line B to B in FIG. 1. FIG. 7B shows a three-dimensional shape formed by a portion in which amount of light exposure (amount of absorption of light) exceeds a predetermined threshold value after an amount of light exposure (amount of absorption of light) at each point in the photosensitive resin is calculated from a light path of the light flux with which the photosensitive resin is irradiated according to a rotation of the rotating table.

As shown in FIG. 5A, the fixed mask pattern 32b includes a pair of light-transmitting parts 32s and 32t formed into a substantially fan shape symmetrical with respect to the central point Os through which the central axis z passes, and a shaded light-blocking part 32y. The light-transmitting parts 32s and 32t are formed on the both sides in a direction Ys orthogonal to the direction of tilt Xs. The light-transmitting parts 32s and 32t are a fan-shaped light-transmitting part having fan shapes formed continuously between a pair of line segments.

As shown in FIGS. 5B and 5C, the mask pattern 22a of the rotating mask plate is the same as that in Embodiment 2, and includes the one circular light-transmitting part 22p formed at a position distant from the central point Or through which the central axis x passes, and the shaded light-blocking part 22x. FIG. 5B shows the case where the light-transmitting part 22p is located at a first position most distant from the central point Os toward one direction in the direction Ys orthogonal to the direction of tilt Xs according to a rotation of the rotating table. FIG. 5C shows the case where the light-transmitting part 22p is located at a second position most distant from the central point Os toward the other direction side in the direction Ys orthogonal to the direction of tilt Xs according to a rotation of the rotating table.

The light-transmitting part 22p of the rotating mask pattern formed on the rotating mask plate moves on the circumferential orbit around the central point Or according to a rotation of the rotating table. The rotating mask pattern is irradiated thereon with the light flux transmitting through the light-transmitting part of the fixed mask pattern. After the light-transmitting part 22p passes through the region on the rotating mask pattern which is irradiated with the light flux, the light flux transmits through the light-transmitting part 22p, and the photosensitive resin is irradiated with the light flux.

When the light-transmitting part 22p of the rotating mask pattern passes through the first position as shown in FIG. 5B, after the entire portion of the light-transmitting part 22p of the rotating mask pattern passes through the region on the rotating mask pattern which is irradiated with the light flux transmitting through one of the light-transmitting parts of the fixed mask pattern shown in FIG. 5A, the region inside the photosensitive resin which is irradiated with the light flux transmitting through the light-transmitting part 22p of the rotating mask pattern is formed into a cylindrical shape.

When an amount of light exposure (amount of absorption of light) of this cylindrical irradiated region exceeds the threshold value, a rod-shaped portion 44c is formed as schematically shown in a perspective view of FIG. 6B. This portion 44c extends parallel to the direction of irradiation of the exposure light to be tilted to one side circumferentially with respect to the central axis z. Even when this portion 44c moves according to a rotation of the rotating table, the portion 44c is tilted to the one side circumferentially with respect to the central axis z as shown by broken line 44t, for example.

On the other hand, when the light-transmitting part 22p of the rotating mask pattern 22b passes through the second position as shown in FIG. 6C, after the entire portion of the light-transmitting part 22p of the rotating mask pattern passes through the region on the rotating mask pattern which is irradiated with the light flux transmitting through the other light-transmitting part of the fixed mask pattern shown in FIG. 5A, the region inside the photosensitive resin which is irradiated with the light flux transmitting through the light-transmitting part 22p of the rotating mask pattern is formed into a cylindrical shape.

When an amount of light exposure (amount of absorption of light) of this cylindrical irradiated region exceeds the threshold value, a rod-shaped portion 44d is formed as schematically shown in FIG. 6B.

The two portions 44c and 44d shown by the solid lines so as to be divided in FIG. 6B actually have a base end in common on the side of the support substrate 40. Accordingly, by the combination of the fixed mask pattern and the rotating mask pattern, as shown in a simulation view of FIG. 7B, a V-shaped microstructure 44y in which the two portions 44c and 44d are tilted toward the sides opposite to one another circumferentially with respect to the central axis z is formed.

Embodiment 4

By using a fixed mask pattern 32c shown in a schematic view of FIG. 8A in which two fan-shaped light-transmitting parts 32u and 32v are formed and a rotating mask pattern 22b in which a plurality of microscopic light-transmitting parts 22t are concentrically formed at an equal pitch as shown in a schematic view of FIGS. 8B and 8C in combination, it is possible to produce a microstructure having a reticulated netted part 48 extending in a concentric pattern as shown in a perspective views of a main part of FIG. 9A.

FIG. 8A is a schematic view of a mask pattern of a fixed mask plate viewed along the line A to A in FIG. 1. FIG. 8B is a schematic view of a mask pattern of a rotating mask plate viewed along the line B to B in FIG. 1. FIG. 8C is a partial enlarged view of FIG. 8B.

As shown in FIG. 8A, the fixed mask pattern 32c includes the pair of light-transmitting parts 32u and 32v formed into a fan shape symmetrical with respect to the central point Os through which the central axis z passes, and a shaded light-blocking part 32z. The light transmitting parts 32u and 32v are formed on the both sides in the direction Ys orthogonal to the direction of tilt Xs. The light-transmitting parts 32u and 32v are a second light-transmitting part.

As shown in FIG. 8B, a circular light-transmitting part 22s is concentrically formed with respect to the central point Or through which the central axis z passes in the central part of the rotating mask pattern 22b. In a fan-shaped region 22q around the light-transmitting part 22s, as shown in FIG. 8C, a plurality of microscopic light-transmitting parts 22t are formed at an equal pitch on the concentric circles shown by the chain lines concentric with respect to the central point Or. The light-transmitting parts 22t are a first light-transmitting part. The rotating pattern 22b includes the light-transmitting parts 22s and 22t and shaded light-blocking parts 22y and 22z.

With the light flux of the exposure light transmitting through the light-transmitting parts 32u and 32v of the fixed mask pattern 32c and the light-transmitting part 22s in the center of the rotating mask pattern 22b, as shown in FIG. 9A, a cylindrical table part 46 is formed from the photosensitive resin 42 supported by the support substrate 40.

Further, with the light flux transmitting through the light-transmitting parts 32u and 32v of the fixed mask pattern 32c and the light-transmitting parts 22t around the rotating mask pattern 22b, as shown in FIG. 9A, a reticulated netted part 48 extending circumferentially with respect to the table part 46 and circumferentially with respect to a central axis 49 is formed into a concentric pattern on the outer side of the table part 46.

The netted part 48 is a part in which V-shaped structures as that in Embodiment 3 are repeatedly formed at intervals circumferentially with respect to the central axis 49. Because the light-transmitting parts 22t in the peripheral area of the rotating mask pattern 22b are circumferentially formed at equal pitch, the V-shaped structures are circumferentially formed at equal pitch so as to correspond to the respective light-transmitting parts 22t in the peripheral area of the rotating mask pattern 22b. Due to the superposition of these V-shaped structures, the V-shaped structures arrayed at equal interval circumferentially with respect to the central axis 49 are formed. By selecting the thickness of the photosensitive resin and the pitch between the light-transmitting parts 22t so as to cross the rod-shaped portions of the V-shaped structures, it is possible to produce the reticulated netted part 48 shown in FIG. 9A.

Next, a producing example of Embodiment 4 will be described.

With respect to the rotating mask plate and the fixed mask plate, after a Cr film was formed on the one principal surface of the glass transparent substrate by sputtering, the Cr film was exposed to etching to form the respective mask patterns 22b and 32c.

SU-8 (light curing resin) that is thick film negative resist was directly applied onto the one principal surface on which the mask pattern 22b was formed of the rotating mask plate, and further, the support substrate was placed on the SU-8, and gas was removed from the SU-8. The support substrate, the SU-8 and the rotating mask plate were fixed to the rotating table of the light exposure device in a state in which they were entirely inverted so as to bring the rotating mask plate upward. The fixed mask plate for limiting the incident direction of exposure light was fixed to thereon.

While rotating the rotating table in a state in which the rotating table was tilted to the irradiating direction of the exposure light, light exposure of the SU-8 disposed on the rotating table was continuously performed.

When the SU-8 is subjected to dipping-development after the light exposure, a microstructure having a mesh structure in which a netted part is formed into a concentric pattern is completed.

The details of light exposure and development are shown in the following table.

TABLE 1

| SU-8 process. | | |
|---|---|---|
| Method | Properties | Time |
| O2 aching | RIE | 10 min |
| Bake | 200 deg. OAP primer | 5 min |
| Spin coating | slop | 5 s |
|  | 3000 rpm | 30 s |
| Bake | 95 deg. SU-8 3025 | 3 min |
| Spin coating | slop | 5 s |
|  | 500 rpm | 5 s |
|  | slop | 8.3 s |
|  | 3000 rpm | 21.7 s |
| Pre-Bake | 65 deg. | 5 min |
|  | 95 deg. | 15 min |
| Relaxation | slow cooling | 30 min |
| Expose |  | 20~120 s |
| PEB | 65 deg. | 1 min |
|  | 95 deg. | 6 min |
| Relaxation |  | 1 hour |
| Development | SU-8 Developer | 6 min |
| Rinse | IPA | over 6 min |
| Hard Bake | Room –> 200 deg. | Over 1 hour |

A three-dimensional microstructure of a wafer size (a diameter of a light-exposure area of a lamp house used for the producing example is 100 mm) by utilizing only a generally-used ultraviolet light source as a light source for light exposure, and in a single light exposure could be produced.

Figure 10:
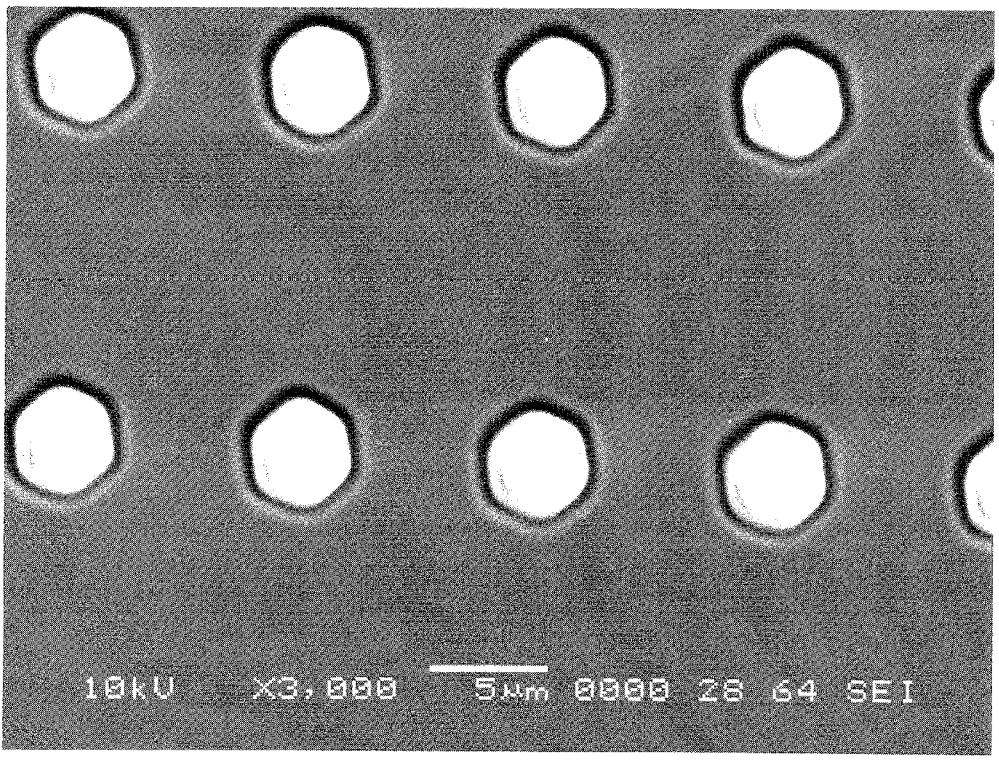
FIG. 10 is a photograph of an SEM image of a rotating mask pattern. (Embodiment 4)

FIG. 10 is a photograph of an SEM image of the light-transmitting parts 22t in the peripheral area of the rotating mask pattern 22b used for the producing example. The light-transmitting parts 22t are circumferentially formed at pitches of 10 μm, and its diameter is 5 μm.

Figure 11:
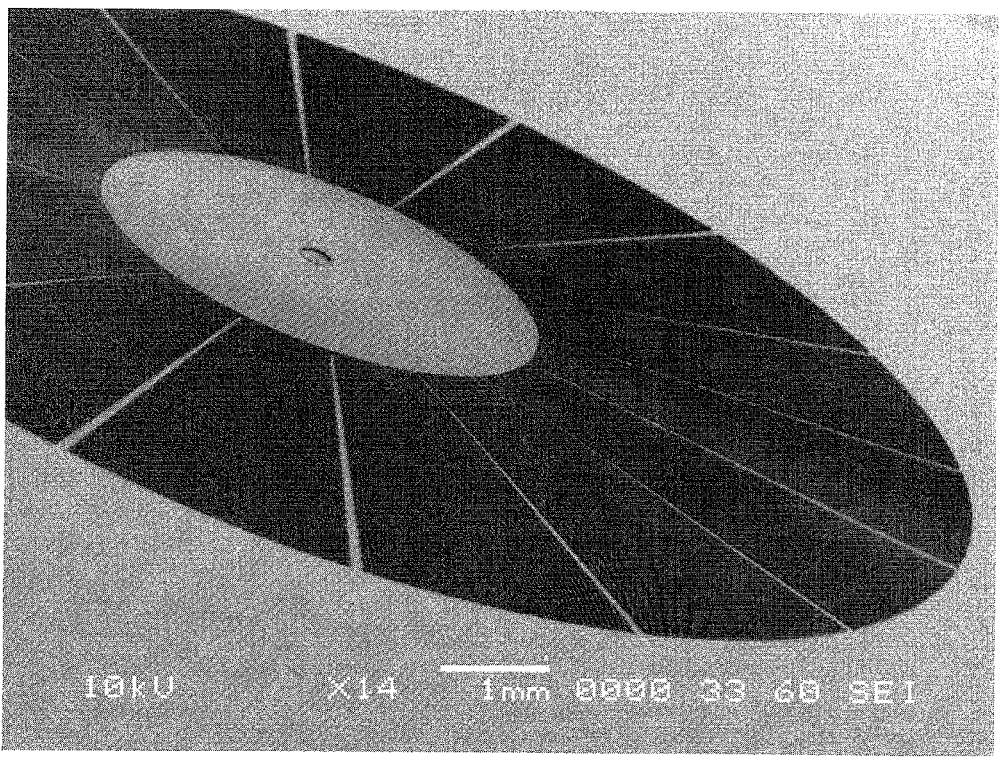
FIG. 11 is a photograph of an SEM image of a produced device. (Embodiment 4)
Figure 12:
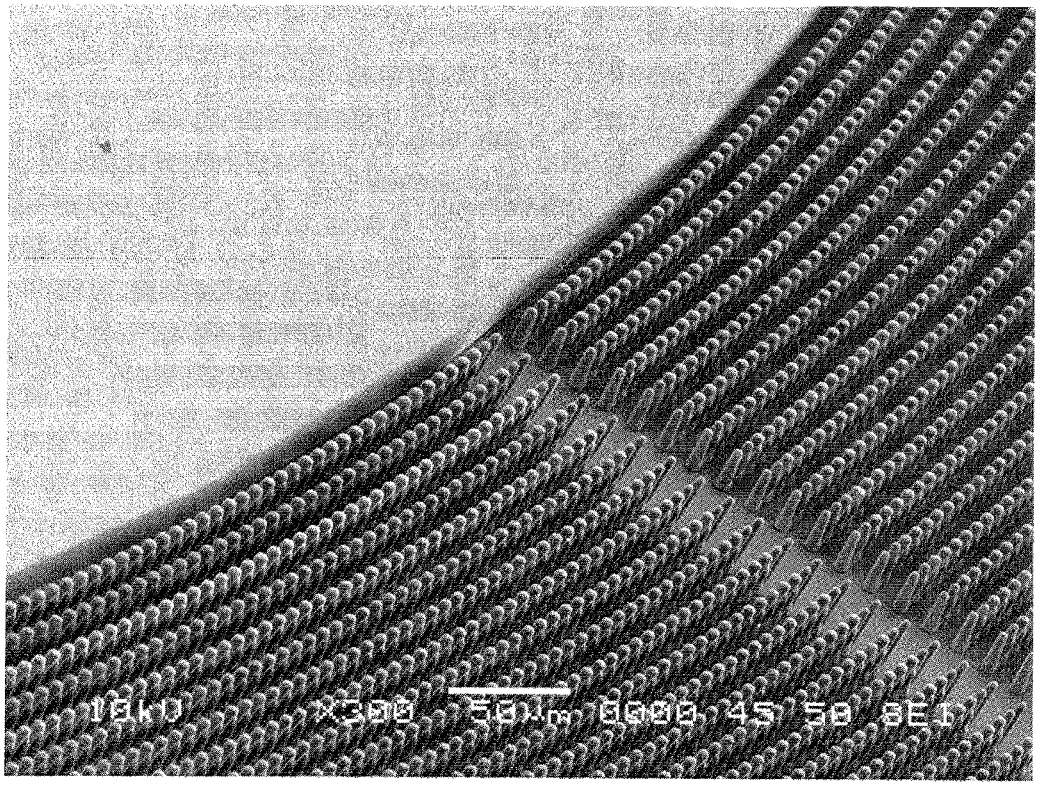
FIG. 12 is a photograph of an SEM image of the produced device. (Embodiment 4)
Figure 13:
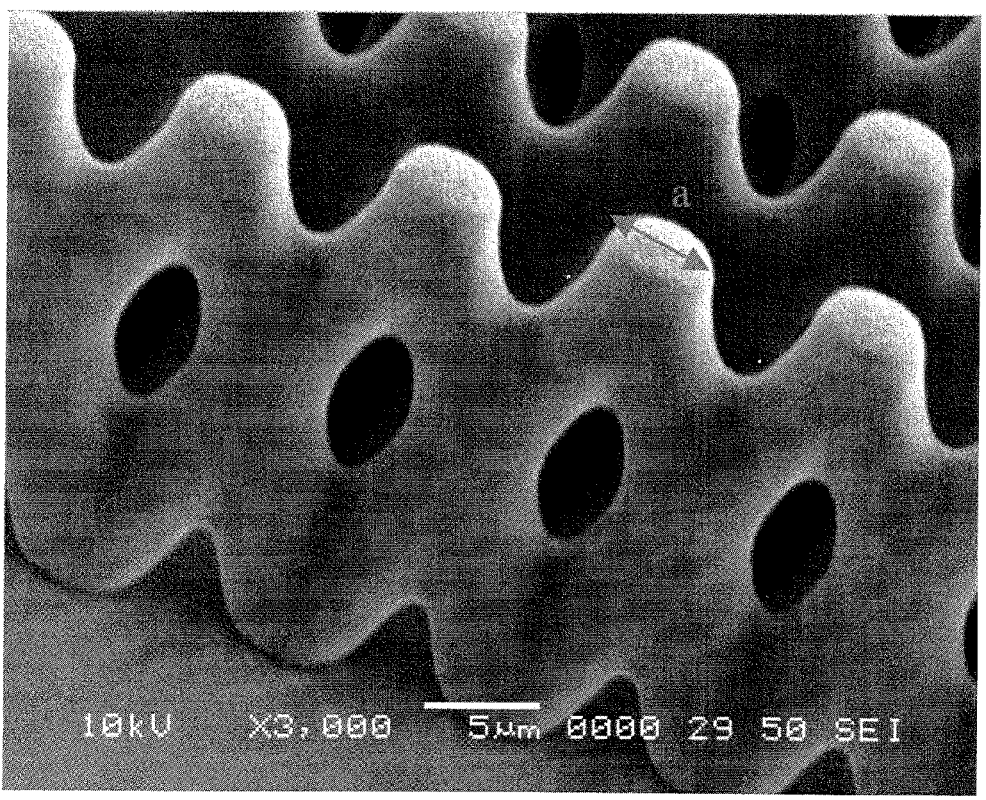
FIG. 13 is a photograph of an SEM image of the produced device. (Embodiment 4)

FIGS. 11 to 13 are photographs of SEM images of the microstructure of the producing example. It is understood from the entire image of FIG. 11 that the concentric pattern structure of a diameter of approximately 15 mm has been formed. Further, from FIG. 12 that is an enlarged view near the center and FIG. 13 that is an enlarged view of the mesh side surface, the condition is understood in which the netted parts 48 of the microstructure are arrayed in a concentric pattern. The microstructure of the producing example is 25 μm in height and an interval of the mesh is 15 μm.

In order to verify the processing accuracy, a change in the cross section of the wire inside the produced mesh (a wire diameter a on the top surface of the mesh wire shown in the SEM image of the mesh structure of FIG. 13) was measured with an amount of light exposure that is one of the main processing parameters serving as an operational object. In detail, a micropore size of the light-transmitting part 22t in the peripheral area of the rotating mask pattern for wire light exposure was fixed to a diameter of 5 μm, a film thickness of the SU-8 to be applied was set to 25 μm (approximately ±0.8 μm), and the wire diameter a was measured.

While adjusting an amount of light exposure of irradiation by changing a light exposure time with reference to an illuminance measured by use of an illuminometer (the UVD-S405 manufactured by Ushio Inc.) at each light exposure, three samples were produced for each of six light exposure conditions of 200 mJ/cm$^2$, 300 mJ/cm$^2$, 350 mJ/cm$^2$, 400 mJ/cm$^2$, 500 mJ/cm$^2$, 600 mJ/cm$^2$, and the produced device was observed on the SEM, to measure the wire diameter a shown in FIG. 13.

Figure 14:
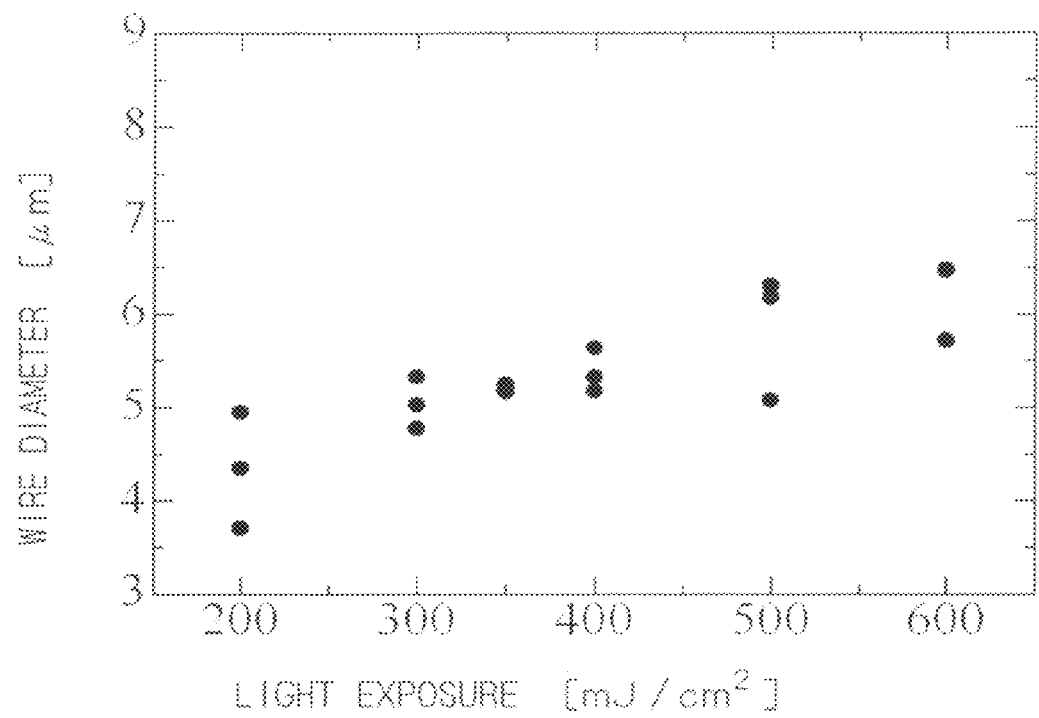
FIG. 14 is a graph showing the relationship between amounts of light exposure and cross-sectional lengths. (Embodiment 4)

The results of measuring the shape of the produced device are shown in a graph of FIG. 14. The amount of light exposure is plotted on the axis of abscissa and the wire diameter of the mesh is plotted on the axis of ordinate. A designed value for the wire diameter a of the mesh wire is 5 μm, which is equal to the diameter of the light-transmitting part 22t in the peripheral area of the rotating mask pattern.

It has been understood from FIG. 14 that the amount of light exposure and the wire diameter are in a proportional relationship, and the diameter of the wire forming the mesh can be controlled within a range of several μm by adjusting an amount of light exposure. It is thought that there is a limit to the proportional relationship of FIG. 14. However, the limit of control of a wire size could not be evaluated within the range of the amount of light exposure at this time.

Next, a chromosome stretching and fixation experiment using the produced device will be described.

As a device for chromosome stretching and fixation which is used for this experiment, a microstructure of the producing example which was produced with the amount of light exposure of 300~350 mJ/cm$^2$ and whose processed shape is close to the designed value was used. As chromosome samples for the stretching and fixation experiment, chromosomes extracted from HeLa cells that are human uterine cervix cancer cells were used.

The experimental procedure is as follows. First, as shown in a perspective view of FIG. 9B, a suspension liquid containing chromosomes 70 is dropped from the leading end of a pipette 60 onto the table part 46, and the device is rotated at high speed (5000 rpm, 30 sec) around the central axis 49 as shown by arrow 50, to centrifugalize it. With this operation, the interlocked chromosomes 70 are radially stretched so as to be chromosomes 72 by an action of flow velocity distribution generated in the liquid as shown by reference numeral 52. The stretched chromosomes 72 are supported so as to be caught on the upper grooves of the netted part 48. Next, the chromosomes are entirely stained with YO-PRO-1, and the condition of stretching of the chromosomes is observed by use of a fluorescence microscope.

Figure 15:
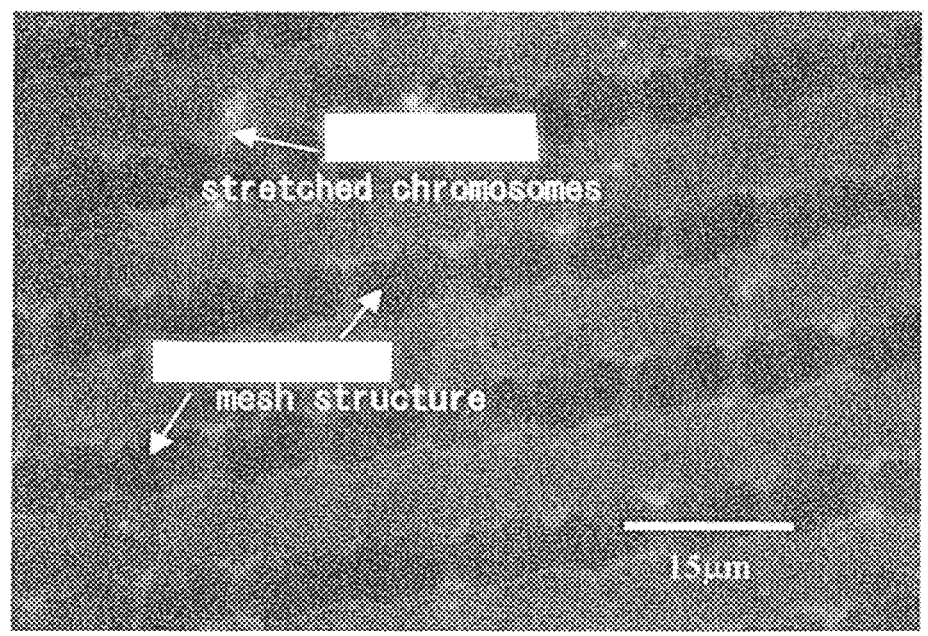
FIG. 15 is a photograph of a fluorescent image of chromosome after suspending. (Embodiment 4)
Figure 16:
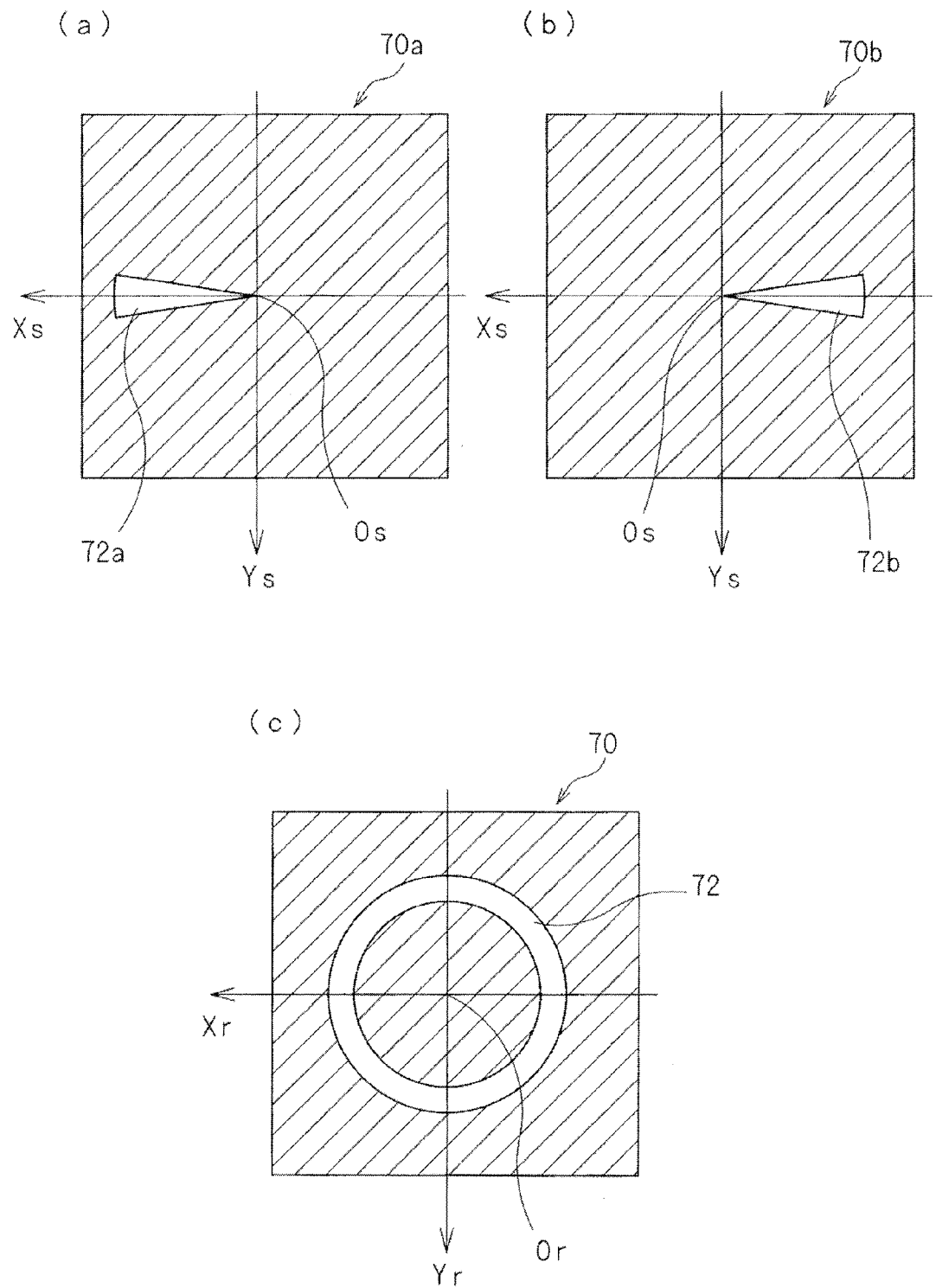
FIG. 16(a) is a schematic view of a mask pattern having a fan-shaped light-transmitting part another schematic view of a mask pattern having a fan-shaped light-transmitting part.
FIG. 16(c) is a schematic view of a mask pattern having a ring-shaped light-transmitting part. (Modified Example)
Figure 17:
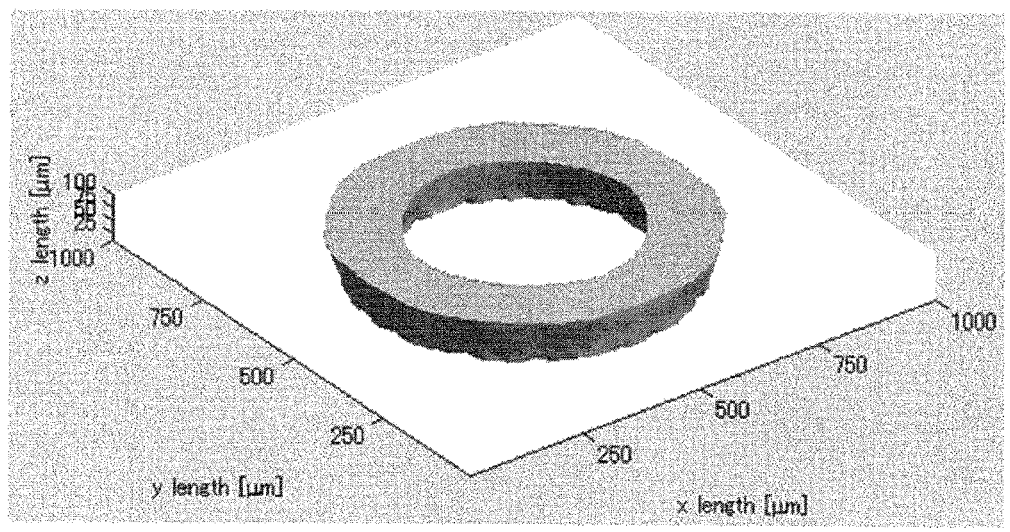
FIG. 17 is a simulation view of a microstructure. (Modified Example)
Figure 18:
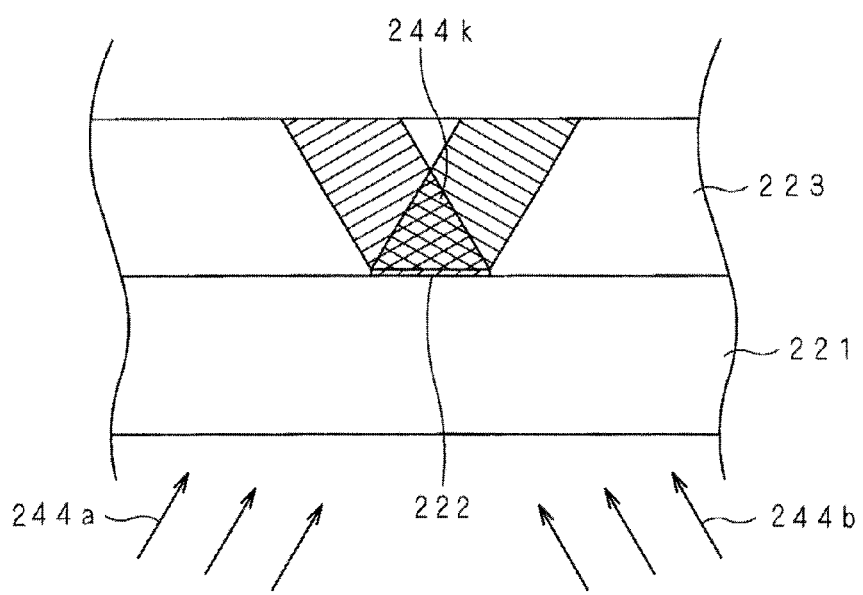
FIG. 18 is an explanatory diagram of a tilt exposure method (Conventional Example 1) (Prior Art).
Figure 19:
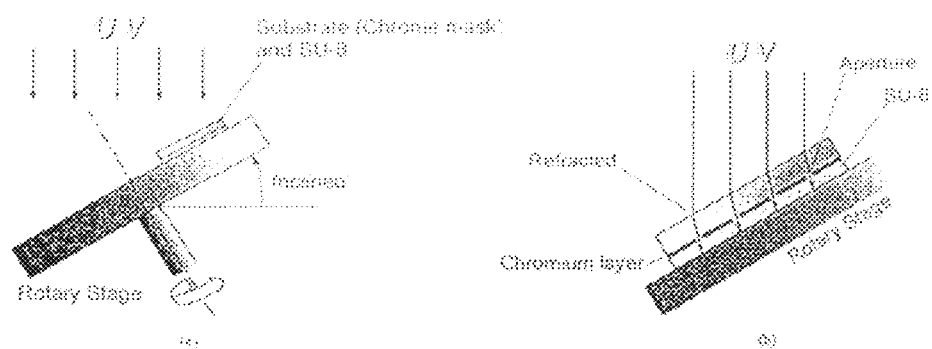
FIG. 19 are explanatory diagrams of a rotating tilt exposure method. (Conventional Example 2) (Prior Art)
Figure 20:
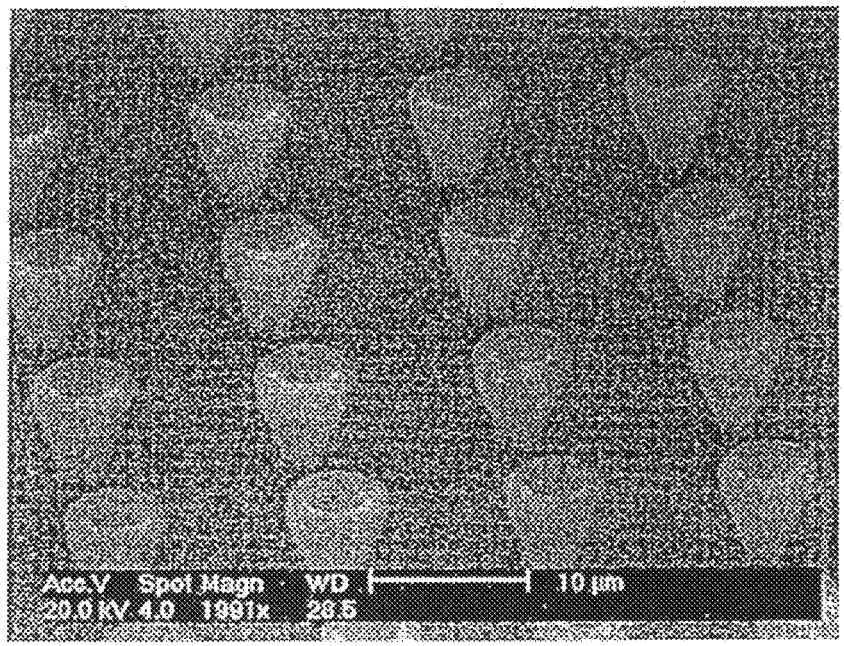
FIG. 20 is a photograph of an example produced by the rotating tilt exposure method. (Conventional Example 2) (Prior Art)

The experimental result is shown in FIG. 15. FIG. 15 is a photograph of a fluorescence image of the chromosomes near the netted part 48 after staining. It is understood from FIG. 15 that the chromosomes are supported in the stretched state on the mesh structure of the netted part, and those are not peeled off from the netted part 48 due to the staining operation.

<Summary> As described above, provided that a single light exposure process in combination of partial light exposure with multiple masks by combining the fixed mask pattern and the rotating mask pattern and a rotating tilt exposure method is performed, it is possible to form a complicated steric-shaped microstructure in a small number of processes.

In addition, the present invention is not limited to the above-described embodiments, and various modifications may be applied to implement the invention.

For example, Embodiment 1 shows the case where the angles of disposing the light-transmitting parts formed on the fixed mask pattern are 0° and 180° to the Xs axis, and Embodiment 2 shows the case where it is 90° to the Xs axis. Meanwhile, this is not limited to these cases, and an arbitrary angle of disposing it may be selected. In this case, the direction of tilt of the rod-shaped portion of the microstructure formed of the photosensitive resin is determined so as to correspond to an angle of disposing the light-transmitting part formed on the fixed mask pattern. By combining the point-like light-transmitting parts, it is possible to synthesize those to form a complicated shape.

Provided that a fixed mask pattern 70a having a fan-shaped light-transmitting part 72a as shown in a schematic view of FIG. 16A and a rotating mask pattern 70 having a ring-shaped light-transmitting part 72 as shown in a schematic view of FIG. 16C are combined, and the photosensitive resin is exposed to light while rotating the rotating mask pattern 70 with the central axis serving as a rotating axis in a state in which a central axis passing through the central points Os and Or is tilted to the same side of the direction of the exposure light in the same way as in Embodiments 1 and 2, it is possible to form a conically-shaped microstructure with a larger diameter on the support substrate side and a smaller diameter on the leading end side.

On the other hand, provided that a fixed mask pattern 70b having a fan-shaped light-transmitting part 72b as shown in a schematic view of FIG. 16B and the rotating mask pattern 70 shown in the schematic view of FIG. 16C are combined, and the photosensitive resin is exposed to light while rotating the rotating mask pattern 70 with the central axis serving as a rotating axis in a state in which the central axis passing through the central points Os and Or is tilted to the same side of the direction of the exposure light in the same way as in Embodiments 1 and 2, it is possible to form a mortar-shaped microstructure with a smaller diameter on the support substrate side and a larger diameter on the leading end side.

Provided that the light-transmitting part of the fixed mask pattern is disposed at a predetermined angle intermediate of those of FIG. 16A and FIG. 16B so as to correspond to the tilt of the central axis passing through the central points Os and Or, it is possible to form a cylindrically-shaped microstructure whose peripheral wall is orthogonal to the support substrate.

Further, in implementation of the present invention, photosensitive resin other than SU-8 may be used. Not only negative type photosensitive resin, but also positive type photosensitive resin may be used.

The shapes and dispositions of the light-transmitting parts of the fixed mask pattern and the rotating mask pattern may be appropriately selected so as to correspond to a steric shape of a microstructure. As a fixed mask pattern and a rotating mask pattern, mask patterns other than the mask patterns which allow transmission of light or block light twofold may be used. For example, a gray-scale mask may be used.

REFERENCE NUMBERS

10: Light exposure device
20: Rotating table
21: Rotating mask plate
22, 22a, 22b: Mask pattern (Rotating mask pattern)
22p, 22s, 22t: Light-transmitting part
22x, 22y, 22z: Light-blocking part
30: Fixed mask attachment plate
31: Fixed mask plate
32, 32a, 32b, 32c: Mask pattern (fixed mask pattern)
32p, 32s, 32t: Light-transmitting part
32x, 32y, 32z: Light-blocking part
40: Support substrate
42: Photosensitive resin
44a, 44b, 44c, 44d: rod-shaped portion
46: Table part
48: Netted part
49: Central axis
Os, Or: central point
Xr, Xs: Direction of tilt
Z: Central axis

The invention claimed is:

1. A method for producing a microstructure comprising:
   a first step of disposing a first mask on a photosensitive resin and disposing a second mask above the first mask, the photosensitive resin being unexposed, the first mask containing a light-transmitting part having a first predetermined amount of light transmitting therethrough and a light-blocking part having a second predetermined amount of light transmitting therethrough, which is smaller than the first predetermined amount, and the second mask containing a light-transmitting part having a third predetermined amount of light transmitting therethrough and a light-blocking part having a fourth predetermined amount of light transmitting therethrough, which is smaller than the third predetermined amount; and
   a second step of integrally rotating the photosensitive resin and the first mask around a central axis of rotation passing through the photosensitive resin and the first mask, and irradiating an exposure light from a first side of the second mask opposite the photosensitive resin and the first mask in a direction angularly disposed relative to the central axis, thereby exposing the photosensitive resin to a light flux of the exposure light transmitting through the second mask and the first mask.

2. The method according to claim 1, wherein the photosensitive resin and the first mask contact each other,
   a boundary face between the photosensitive resin and the first mask is a plane surface perpendicular to the central axis, and
   the second mask is disposed parallel to the first mask.

3. The method according to claim 2, wherein the light-transmitting part of the second mask includes a fan-shaped light-transmitting part having a fan shape which is formed continuously between a pair of line segments extending radially with respect to a circle centering on the central axis.

4. The method according to claim 2, wherein the photosensitive resin is light curing resin,
   the light-transmitting part of the first mask includes a plurality of microscopic first light-transmitting parts which is disposed concentrically with respect to the central axis and is spaced circumferentially with respect to a circle centering on the central axis,
   the light-transmitting part of the second mask includes a pair of second light-transmitting parts which is formed on both sides of a virtual line with respect to a virtual plane, the virtual plane includes the central axis and is parallel to a direction of the exposure light, the virtual line is orthogonal to the virtual plane and passes through a central point on which the central axis and the second mask cross, and
   during the second step, the light curing resin is exposed in a reticulated shape extending concentrically with respect to the central axis due to the exposure light passing through the second light-transmitting part and the first light-transmitting part.

5. The method according to claim 2, wherein the first mask has a transparent substrate facing a second side of the second mask.

6. The method according to claim 5, wherein the second mask has another transparent substrate on the first side of the second mask.

* * * * *